(12) United States Patent
Yoon

(10) Patent No.: US 11,961,908 B2
(45) Date of Patent: Apr. 16, 2024

(54) VERTICAL TRANSISTOR AND METHOD FOR FABRICATING THE SAME

(71) Applicant: SK hynix Inc., Gyeonggi-do (KR)

(72) Inventor: Young Gwang Yoon, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/462,765

(22) Filed: Aug. 31, 2021

(65) Prior Publication Data
US 2022/0223734 A1    Jul. 14, 2022

(30) Foreign Application Priority Data
Jan. 12, 2021    (KR) .......................... 10-2021-0003864

(51) Int. Cl.
*H01L 29/78*    (2006.01)
*H01L 29/24*    (2006.01)
*H01L 29/66*    (2006.01)

(52) U.S. Cl.
CPC .... *H01L 29/7827* (2013.01); *H01L 29/66969* (2013.01); *H01L 29/24* (2013.01)

(58) Field of Classification Search
CPC ........... H01L 29/7827; H01L 29/78642; H01L 29/66666; H01L 29/24; H01L 29/7833–1836; H01L 29/1041–105
See application file for complete search history.

(56) References Cited

U.S. PATENT DOCUMENTS

| | | | | |
|---|---|---|---|---|
| 2008/0251825 A1* | 10/2008 | Lee | .................... | H01L 29/42392 257/E29.264 |
| 2009/0008630 A1* | 1/2009 | Hurkx | ..................... | H01L 29/78 257/E21.41 |
| 2009/0008631 A1* | 1/2009 | Hurkx | ................... | B82Y 10/00 257/E21.41 |
| 2010/0279474 A1* | 11/2010 | Akimoto | ............. | H01L 29/7869 257/E21.411 |
| 2011/0266542 A1* | 11/2011 | Ryu | ...................... | H01L 27/124 257/66 |
| 2016/0071970 A1* | 3/2016 | Hatcher | .............. | H01L 29/0847 257/192 |
| 2018/0269280 A1* | 9/2018 | Sanchez | .............. | H01L 29/1606 |
| 2018/0269284 A1* | 9/2018 | Ansari | ................ | H01L 29/0673 |
| 2019/0067375 A1* | 2/2019 | Karda | ................. | H01L 27/1225 |
| 2020/0058798 A1* | 2/2020 | Pillarisetty | ............ | H01L 29/775 |
| 2020/0111908 A1 | 4/2020 | Sills et al. | | |

(Continued)

*Primary Examiner* — Vincent Wall
(74) *Attorney, Agent, or Firm* — IP & T GROUP LLP

(57) ABSTRACT

Various embodiments of the present invention disclosure are directed to a vertical transistor having different doping profiles in its upper channel layer and lower channel layer for reducing leakage current while enhancing contact resistance and a method for manufacturing the vertical transistor. According to an embodiment of the present invention disclosure, a semiconductor device comprises a lower contact, a vertical channel layer on the lower contact, the vertical channel layer including a metal component and an oxygen component, and an upper contact on the vertical channel layer. The vertical channel layer has a gradual doping profile in which a doping concentration of the metal component is lowest in an intermediate region and gradually increases from the intermediate region to the upper contact.

10 Claims, 16 Drawing Sheets

(56) References Cited

U.S. PATENT DOCUMENTS

2021/0376157 A1* 12/2021 Doornbos ............. H01L 29/785
2022/0069083 A1*  3/2022 Pulugurtha ....... H01L 27/11502
2022/0223734 A1*  7/2022 Yoon ................ H01L 29/66969

* cited by examiner

VERTICAL TRANSISTOR AND METHOD FOR FABRICATING THE SAME

CROSS-REFERENCE TO RELATED APPLICATIONS

The present application claims priority of Korean Patent Application No. 10-2021-0003864, filed on Jan. 12, 2021, which is herein incorporated by reference in its entirety.

BACKGROUND

1. Field

The present invention disclosure relates to a vertical transistor and a method of manufacturing the same, and, more specifically, to a vertical transistor using an oxide semiconductor as a channel layer and a method of manufacturing the same.

2. Description of the Related Art

As memory devices are highly integrated, technologies for applying vertical transistors have been proposed to increase the density of transistors. Technologies for applying an oxide semiconductor having excellent electrical characteristics as a channel material for vertical transistors have also been proposed.

SUMMARY

Various embodiments of the present invention disclosure are directed to a vertical transistor having different doping profiles in its upper channel layer and lower channel layer for reducing leakage current while enhancing contact resistance and a method for manufacturing the vertical transistor.

According to an embodiment of the present invention disclosure, a semiconductor device comprises a lower contact, a vertical channel layer on the lower contact, the vertical channel layer including a metal component and an oxygen component, and an upper contact on the vertical channel layer. The vertical channel layer has a gradual doping profile in which a doping concentration of the metal component is lowest in an intermediate region and gradually increases from the intermediate region to the upper contact.

According to an embodiment of the present invention disclosure, a vertical transistor comprises a lower contact on a substrate, is a channel layer including a lower channel layer, an intermediate channel layer, and an upper channel layer sequentially formed on the lower contact, the channel layer including a metal component and an oxygen component, and an upper contact on the upper channel layer. The channel layer has a gradual doping profile in which a doping concentration of the metal component is lowest in the intermediate channel layer and, in the upper channel layer, gradually increases towards the upper contact.

According to an embodiment of the present invention disclosure, a method for manufacturing a vertical transistor comprises forming a lower contact material on a substrate, forming a lower channel material including a metal component and an oxygen component on the lower contact material, forming a channel material including a metal component and an oxygen component on the lower channel material, and performing a treatment on the channel material to separate the channel material into an intermediate channel material and an upper channel material on the intermediate channel material.

According to an embodiment of the present invention disclosure, leakage current may be reduced by forming different doping profiles in the upper channel layer and the lower channel layer.

According to an embodiment of the present invention disclosure, contact resistance may be enhanced by forming a upper insertion layer between the channel layer and the upper contact and a lower insertion layer between the channel layer and the lower contact.

DETAILED DESCRIPTION

Figure 1:
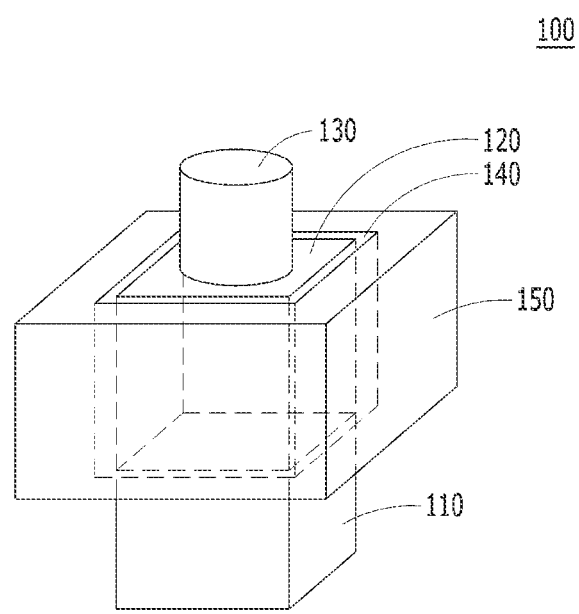
FIG. 1 is a perspective view illustrating a vertical transistor according to an embodiment.

Example cross-sectional views, plan views, and block diagrams may be used herein to describe various embodiments of the disclosure, and modifications may be made thereto according to, e.g., manufacturing techniques and/or tolerances. Thus, embodiments of the disclosure are not limited to specific types as shown and illustrated herein but may rather encompass changes or modifications resultant from fabricating processes. For example, the regions or areas shown in the drawings may be schematically shown, and their shapes shown are provided merely as examples, rather as limiting the category or scope of the disclosure. Elements shown in the drawings may be exaggerated in light of their thicknesses and intervals for illustration purposes. Well known components or elements irrelevant to the subject matter of the disclosure may be omitted from the description. The same or substantially the same reference denotations are used to refer to the same or substantially the same elements throughout the specification and the drawings. Hereinafter, embodiments of the disclosure are described in detail with reference to the accompanying drawings.

FIG. 1 is a perspective view illustrating a vertical transistor according to an embodiment.

As illustrated in FIG. 1, a vertical transistor 100 may include a stack structure including a lower contact 110, a channel layer 120, and an upper contact 130. The vertical transistor 100 may further include a dielectric layer 140 and gate 150 formed on a side surface of the channel layer 120. That is, the lower contact 110, the channel layer 120, and the upper contact 130 may have a stack structure in a direction extending perpendicular to a substrate (not shown), while the dielectric layer 140 and the gate 150 may have a stack structure in a direction extending parallel to the substrate (not shown).

The lower contact 110 and the channel layer 120 may have a square column shape, however, the shape of the lower contact 110 and the channel layer 120 may not be limited thereto, and may include various other shapes (e.g., a rectangular column shape or a cylindrical shape), as may be needed. The lower contact 110 and the channel layer 120 may have the same width. The upper contact 130 may have a cylindrical shape, however, the shape of the upper contact 130 may not be limited thereto, and may include various other shapes (e.g, a square column shape or a rectangular column shape), as may be needed.

The diameter (or width when the upper contact 130 has a square column shape) of the upper contact 130 may be smaller than the diameter (or width) of the channel layer 120. The dielectric layer 140 may be formed on a side surface of the channel layer 120. The dielectric layer 140 may cover all sidewalls of the channel layer 120. That is, the dielectric layer 140 may be formed to surround the entire side surface of the channel layer 120. The channel layer 120 and the dielectric layer 140 may have the same height. Height refers to the dimension of the channel layer 120 and dielectric layer 140 in the direction in which they are stacked. The gate 150 may be formed to surround the dielectric layer 140. The thickness of the gate 150 may be larger than the thickness of the dielectric layer 140. The gate 150 may cover all sidewalls of the dielectric layer 140. That is, the gate 150 may be formed to surround the entire side surface of the dielectric layer 140. Accordingly, the dielectric layer 140 may be positioned between the gate 150 and the channel layer 120.

The lower contact 110 may be disposed on the substrate, for example, a semiconductor substrate (not shown). The lower contact 110 may include a metal-containing material. The lower contact 110 may include a metal or a metal compound. The lower contact 110 may include a tungsten-containing material. Alternatively, the lower contact 110 may include a semiconductor material. The lower contact 110 may include a silicon-containing material. The lower contact 110 may be doped with an impurity.

The channel layer 120 may he positioned on the lower contact 110. The channel layer 120 may be referred to as a 'vertical channel layer'. The channel layer 120 may include an oxide. The channel layer 120 may include a metal component and an oxygen component. The channel layer 120 may include an oxide semiconductor. For example, the channel layer 120 may include at least one of indium (In), gallium (Ga), or zinc (Zn). The channel layer 120 may include InSn, InGaZnO, InSnZnO, InGASnO, InSnO, InZnO, InGaO, or a combination thereof. The channel layer 120 may be doped with an impurity. The channel layer 120 may be doped with silicon (Si) or germanium (Ge). The doping profile of the metal material according to the height of the channel layer 120 may not be uniform. An example of a doping profile is described below.

The upper contact 130 may be positioned on the channel layer 120. The upper contact 130 may include the same material as the lower contact 110. In another embodiment, the upper contact 130 may include a different material from that of the lower contact 110. The upper contact 130 may include a metal-containing material. The upper contact 130 may include a metal or a metal compound. The upper contact 130 may include a tungsten-containing material. Alternatively, the upper contact 130 may include a semiconductor material. The upper contact 130 may include a silicon-containing material. The upper contact 130 may be doped with an impurity. Any suitable impurity may be used.

The vertical transistor 100 may include the gate 150 surrounding the sidewalls of the channel layer 120 while sharing the same axis. The dielectric layer 140 may be positioned between the gate 150 and the channel layer 120. The gate 150 may be spaced apart from the channel layer 120 by the dielectric layer 140. The gate 150 may include a metal or a metal compound. The dielectric layer 140 may be any suitable dielectric layer known in the art. According to an embodiment, the dielectric layer 140 may include a high-k material, such as $HfO_2$, $ZrO_2$ or other metal oxides.

Figure 2:
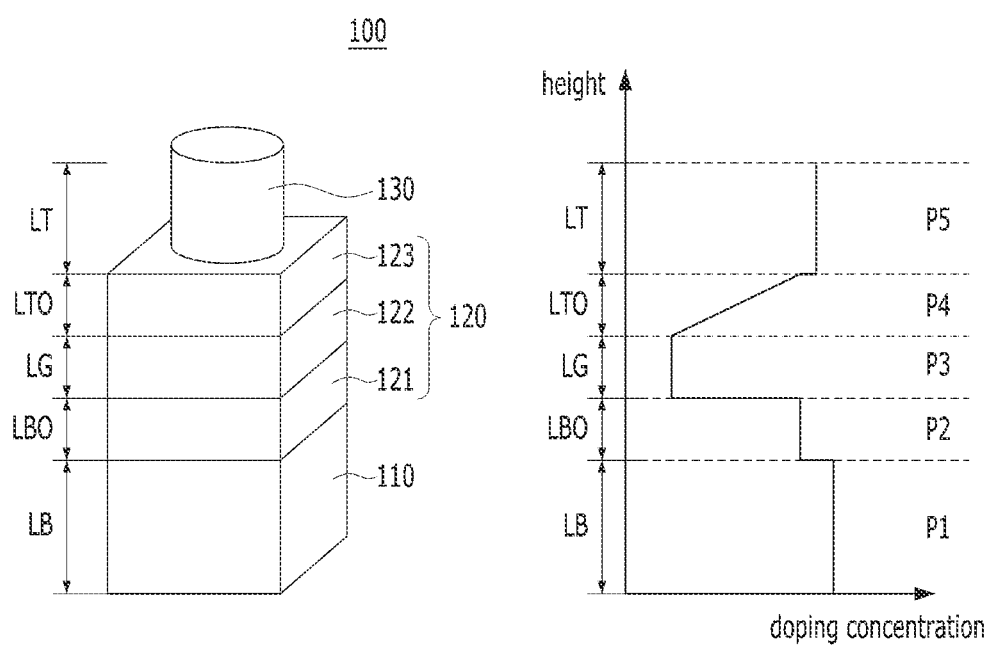
FIG. 2 is a perspective view illustrating an upper contact, lower contact, and channel layer of a vertical transistor according to an embodiment.

FIG. 2 is a perspective view illustrating an upper contact, lower contact, and channel layer of a vertical transistor according to an embodiment. FIG. 2 is a view in which the dielectric layer 140 and gate 150 of FIG. 1 are omitted to describe the channel layer 120 of FIG. 1.

As illustrated in FIG. 2, the channel layer 120 may include a lower channel layer 121 formed on the lower contact 110, an intermediate channel layer 122 formed on the lower channel layer 121, and an upper channel layer 123 formed on the intermediate channel layer 122. That is, the channel layer 120 may include a stack of the lower channel layer 121, the intermediate channel layer 122, and the upper channel layer 123. The height LBO of the lower channel layer 121, the height LG of the intermediate channel layer 122, and the height LTO of the upper channel layer 123 may be the same or different.

The channel layer 120 may include an oxide. The channel layer 120 may include a metal material and an oxygen material. The channel layer 120 may include an oxide semiconductor. The channel layer 120 may be doped with an impurity. In the channel layer 120, the doping profile of impurities according to the height may not be uniform. The doping profiles of impurities may be different in the lower channel layer 121, the intermediate channel layer 122, and the upper channel layer 123, respectively.

The graph of FIG. 2 illustrates the doping concentration of the metal component as a function of a height position. Metailicity may increase as the doping concentration increases. As the metallicity of the upper surface of the channel layer 120 increases, the contact resistance to the upper contact 130 may decrease. As the metallicity of the lower surface of the channel layer 120 increases, the contact resistance to the lower contact 110 may decrease.

The channel layer 120 may have a gradual doping profile in which the doping concentration of the metal component gradually increases in the region closer to the upper contact 130, e.g., as going closer to the upper contact 130 from the boundary between the intermediate channel layer 122 and the upper channel layer 123. The channel layer 120 may have an abrupt doping profile in which the doping concentration of the metal component abruptly varies in the region closer to the lower contact 110, e.g., at the boundary between the intermediate channel layer 122 and the lower channel layer 121. That is, at the boundary between the intermediate channel layer 122 and the lower channel layer 121, the doping concentration of the metal component may increase rapidly. For example, the abrupt doping profile may include a step change profile.

The doping concentration may be divided into a first doping region P1 according to the height LB of the lower contact, a second doping region P2 according to the height LBO of the lower channel layer, a third doping region P3 according to the height LG of the intermediate channel layer, a fourth doping region P4 according to the height LTO of the upper channel layer, and a fifth doping region P5 according to the height LT of the upper contact. The doping concentration of the first to fifth doping regions P1 to P5 may be continuous. The doping concentration in the instant embodiment refers to the doping concentration of the metal component.

First, the doping concentrations of the first doping region P1, the second doping region P2, and the third doping region P3 may each include a constant value. That is, in the lower contact 110, the lower channel layer 121, and the intermediate channel layer 122, the doping concentration of the metal component doped in the film may be uniformly maintained. The doping profiles of the first doping region P1, the second doping region P2, and the third doping region P3 may include a stepped profile. The doping concentration of the first doping region P1 may be greater than the doping concentration of the second doping region P2 and the third doping region P3. The doping concentration of the second doping region P2 may be greater than the doping concentration of the third doping region P3. The third doping region P3 may include the lowest doping concentration among the first to fifth doping regions P1 to P5. The difference in doping concentration between the second doping region P2 and the third doping region P3 may be greater than the difference in doping concentration between the first doping region P1 and the second doping region P2. The difference in doping concentration between the second doping region P2 and the third doping region P3 may be at least two times greater than the difference in doping concentration between the first doping region P1 and the second doping region P2. That is, there may be provided an abrupt doping profile in which at the boundary between the third doping region P3 and the second doping region P2, the doping concentration of the metal component rapidly increases from the third doping region P3 to the second doping region P2. As the difference in doping concentration between the third doping region P3 and the second doping region P2 increases, the difference in doping concentration between the second doping region P2 and the first doping region P1 may decrease. As the difference in doping concentration between the second doping region P2 and the first doping region Pt decreases, the contact resistance to the lower contact 110 may decrease.

The doping concentration of the fourth doping region P4 may increase with a constant slope in a direction from the fourth doping region P4 to the fifth doping region P5. The doping concentration of the fourth doping region P4 may increase from a doping concentration equal to the doping concentration of the third doping region P3 to a doping concentration equal to the doping concentration of the fifth doping region P5. The doping concentration of the fourth doping region P4 may increase from a doping concentration equal to the doping concentration of the third doping region P3 to a doping concentration equal to the doping concentration of the second doping region P2. That is, the fourth doping region P4 may include a gradual doping profile in which the doping concentration of the metal component gradually increases as it approaches the upper surface of the upper channel layer 123.

In another embodiment, the doping profile of the fourth doping region P4 may have an increased slope of the doping concentration according to the height. In another embodiment, the doping profile of the fourth doping region P4 may have a reduced slope. As the fourth doping region P4 has a gradual doping profile, leakage current may be reduced. As the difference in doping concentration between the fourth doping region P4 and the fifth doping region P5 decreases, the contact resistance to the upper contact 130 may decrease.

The doping concentration of the fifth doping region P5 may have a constant value. The doping concentration of the fifth doping region P5 may be lower than or equal to the doping concentration of the first doping region P1. The doping concentration of the fifth doping region P5 may be continuous from the doping concentration of the fourth doping region P4.

According to the present embodiment, the leakage current of the vertical transistor 100 may be reduced by varying the doping profile of impurities as a function of the height. According to the present embodiment, the contact resistance to the lower contact 110 and the upper contact 130 may be reduced by forming a higher doping concentration at the upper and lower surfaces of the channel layer 120.

FIGS. 3A to 3I are views illustrating a method of manufacturing a vertical transistor according to an embodiment.

Figure 3A:
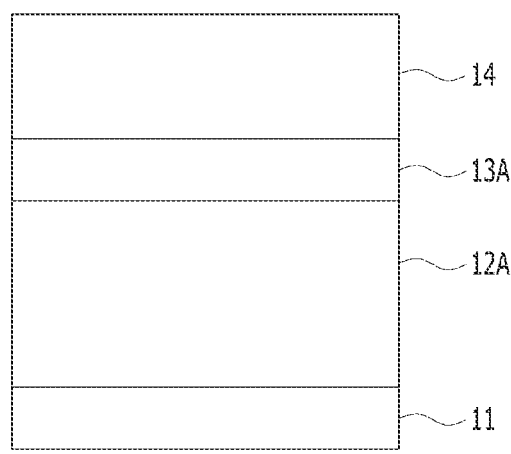
FIGS. 3A, 3C, 3D, 3E, 3F, 3G, 3H, and 3I are views illustrating an example method for manufacturing a vertical transistor according to an embodiment.

Referring to FIG. 3A, a substrate 11 may be prepared. The is substrate 11 may include a semiconductor substrate. The substrate 11 may be formed of a silicon-containing material. The substrate 11 may include other semiconductor material, e.g., germanium. The substrate 11 may include a III-V group semiconductor substrate. The substrate 11 may include a compound semiconductor substrate, such as GaAs. The substrate 11 may include a silicon-on-insulator (SOI) substrate.

A lower contact material 12A may be formed on the substrate 11. The lower contact material 12A may include a metal-containing material. The lower contact material 12A may include a metal or a metal compound. The lower contact material 12A may include a tungsten-containing material. The lower contact material 12A may be doped with an impurity. In another embodiment, the lower contact material 12A may include a silicon-containing material. The lower contact material 12A may include polysilicon. The lower contact material 12A may include impurity-doped polysilicon.

A lower channel material 13A may be formed on the lower contact material 12A. The thickness of the lower channel material 13A may be smaller than the thickness of the lower contact material 12A. The lower channel material 13A may include an oxide. The lower channel material 13A may include a metal component and an oxygen component. The lower channel material 13A may include an oxide semiconductor. For example, the lower channel material 13A may include at least one of indium (In), gallium (Ga), or zinc (Zn). The lower channel material 13A may include InSn, InGaZnO, InSnZnO, InGASnO, InSnO, InZnO, InGaO, or a combination thereof. The lower channel material 13A may be doped with an impurity. For example, the lower channel material 13A may be doped with silicon (Si) or germanium (Ge).

The lower channel material 13A may be deposited in an oxygen atmosphere. The lower channel material 13A may be deposited in a low-concentration oxygen atmosphere ($O_2$ Ambient). Accordingly, oxygen deficiency is increased, thereby forming a film with a high doping concentration of metal component. The lower channel material 13A may include a doping profile having a constant doping concentration. The doping concentration of the lower channel material 13A may be the same or different (e.g., lower) than the doping concentration of the lower contact material 12A.

The lower channel material 13A may be formed by a method, such as chemical vapor deposition (CVD), physical vapor deposition (PVD), atomic layer deposition (ALD), plasma enhanced CVD (PECVD), or plasma enhanced ALD (PEALD). The lower channel material 13A may be deposited at room temperature. Deposition at room temperature may prevent oxygen diffusion.

A channel material 14 may be formed on the lower channel material 13A. The thickness of the channel material 14 may be larger than the thickness of the lower channel material 13A.

The channel material 14 may include the same material as the material of the lower channel material 13A. The channel material 14 may include an oxide. The channel material 14 may contain a metal component and an oxygen component. The channel material 14 may include an oxide semiconductor. For example, the channel material 14 may include at least one of indium (In), gallium (Ga), or zinc (Zn). The channel material 14 may include InSn, InGaZnO, InSnZnO, InGASnO, InSnO, InZnO, InGaO, or a combination thereof. The channel material 14 may be doped with impurities. For example, the channel layer 120 may be doped with silicon (Si) or germanium (Ge).

The channel material 14 may be deposited in an oxygen atmosphere. The channel material 14 may be deposited in a high-concentration oxygen atmosphere ($O_2$ Ambient). Accordingly, oxygen deficiency is reduced, thereby forming a film with a low doping concentration of metal component. The channel material 14 may include a doping profile having a constant doping concentration. The doping concentration of the metal component of the channel material 14 may be smaller than the doping concentration of the lower channel material 13A. At the boundary between the lower channel material 13A and the channel material 14, the doping concentration of the metal component may abruptly change. Accordingly, an abrupt doping profile may be formed in which at the boundary between the lower channel material 13A and the channel material 14, the doping concentration of the metal component rapidly changes.

The channel material 14 may be formed by a method, such as chemical vapor deposition (CVD), physical vapor deposition (PVD), atomic layer deposition (ALD), plasma enhanced CVD (PECVD), or is plasma enhanced ALD (PEALD). The channel material 14 may be deposited at room temperature. Deposition at room temperature may prevent oxygen diffusion.

The lower channel material 13A and the channel material 14 may be formed ex-situ in their respective devices, or may be formed in-situ in one device.

Figure 3B:
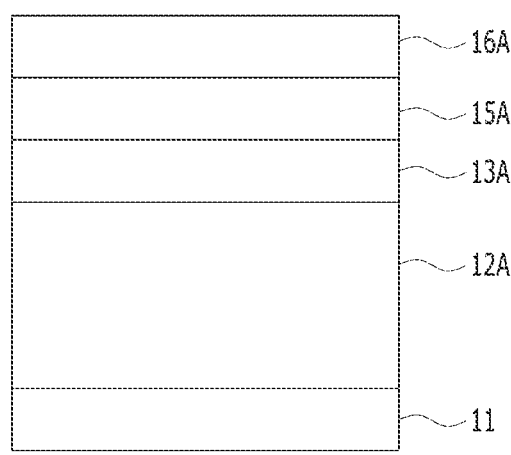

As illustrated in FIG. 3B, the channel material 14 may be separated into an intermediate channel material 15A and an upper channel material 16A. The intermediate channel material 15A and the upper channel material 16A may be divided according to doping profiles. The step of separating the channel material 14 into the intermediate channel material 15A and the upper channel material 16A may be performed in-situ with the step of forming the channel material 14.

To separate the channel material 14 into the intermediate channel material 15A and the upper channel material 16A, a treatment may be performed. As the treatment is performed, the doping profile according to the height of the channel material 14 may be adjusted. As the treatment is performed, oxygen deficiency may be formed in the channel material 14. Oxygen deficiency may be formed to increase toward an upper level of the channel material. Accordingly, the channel material 14 may be divided into the intermediate channel material 15A having a constant doping concentration of the metal material and the upper channel material 16A having a doping concentration of the metal material gradually increasing toward the upper surface of the channel is material 14. The doping concentration of the intermediate channel material 15A may be the same as the doping concentration at the time of deposition of the channel material 14. The intermediate channel material 15A may include a constant doping profile. The upper channel material 16A may include a doping profile that increases with a constant slope from the doping concentration of the intermediate channel material 15A. In another embodiment, the doping profile of the upper channel material 16A may include a slope that is not constant. The upper channel material 16A may include a gradual doping profile in which the doping concentration of the metal component gradually increases as it approaches the upper surface.

The treatment may include use of plasma. For example, plasma treatment energy may be adjusted to form oxygen deficiency. The plasma treatment energy may increase from an upper level to a lower level of the upper channel material 16A.

The treatment may include use of ions. For example, the ions may include inert gases, such as He, Ne, Ar, Kr, Xe, or a combination thereof which may be used to perform the treatment. Both plasma and ions may be used to form oxygen deficiency. The treatment using both plasma and ions may be referred to as 'multi plasma treatment'. When performing the 'multi-plasma treatment', a higher doping concentration may be formed at the upper surface of the upper channel material 16A.

Accordingly, the doping profile of the metal material according to the height of FIG. 3B may be the same as the doping profile of the first to fourth doping regions P1 to P4 illustrated in FIG. 2A.

Figure 3C:
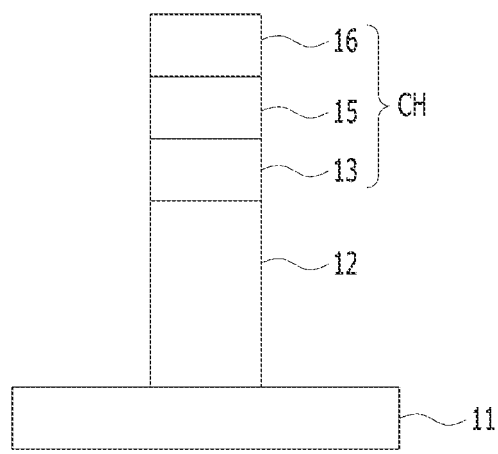

As illustrated in FIG. 3C, the upper channel material 16A, the intermediate channel material 15A, the lower channel material 13A, and the lower contact material 12A may be etched, thereby forming the upper channel layer 16, the intermediate channel layer 15, the lower channel layer 13, and the lower contact 12, respectively. The upper channel layer 15, the intermediate channel layer 15, and the lower channel layer 13 may constitute a channel layer CH.

The upper channel material 16A, the intermediate channel material 15A, the lower channel material 13A, and the lower contact material 12A may be etched using a first mask (not shown) as an etching mask. Accordingly, the upper channel layer 16, the intermediate channel layer 15, the lower channel layer 13, and the lower contact 12 may have the same width. The channel layer CH and the lower contact 12 may have a rectangular column shape. In another embodiment, the channel layer CH and the lower contact 12 may have a different shape (e.g., a cylindrical shape).

Figure 3D:
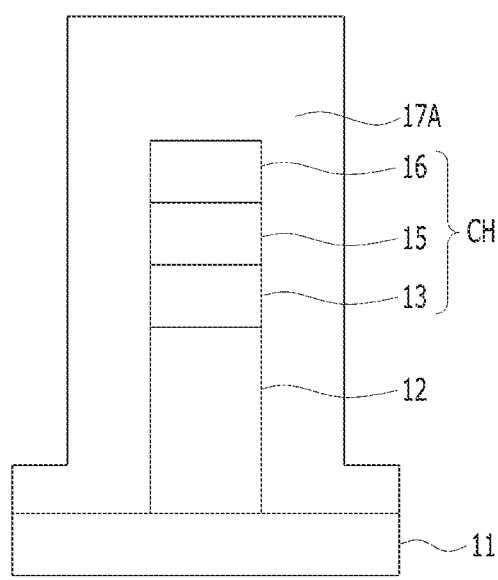

As illustrated in FIG. 3D, an upper contact material 17A covering the channel layer CH and the lower contact 12 may be formed. The upper contact material 17A may also cover the surface of the substrate 11.

The upper contact material 17A may include the same material as the lower contact 12. The upper contact material 17A may include a metal-containing material. The upper contact material 17A may include a metal or a metal compound. The upper contact material 17A may include a tungsten-containing material. The upper contact material 17A may be doped with impurities. In another embodiment, the upper contact material 17A may include a silicon-containing material. The upper contact material 17A may include polysilicon. The upper contact material 17A may include polysilicon doped with impurities.

Figure 3E:
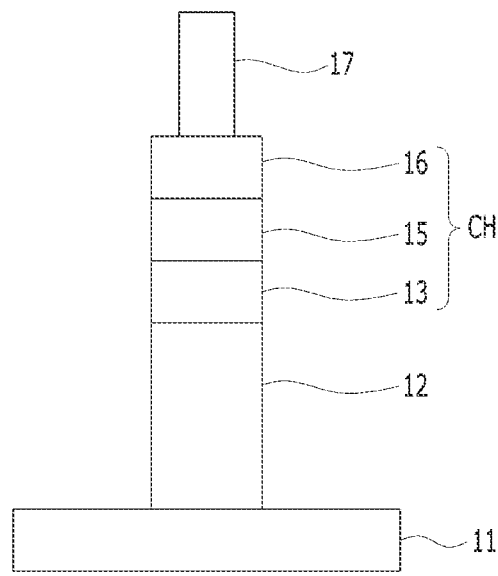

As illustrated in FIG. 3E, an upper contact 17 may be formed on the channel layer CH.

The upper contact material 17A may be etched to form the upper contact 17 using a second mask (not shown) as an etching mask. The upper contact 17 may have a cylindrical shape. The diameter (or width) of the upper contact 17 may be smaller than the diameter (or width) of the channel layer CH. The height of the upper contact 17 may be the same as or different from the height of the lower contact 12.

In another embodiment, when forming the upper contact 17, the channel layer CH and the lower contact 12 may be formed together. In this case, the upper contact 17, the channel layer CH, and the lower contact 12 may have the same width. The upper contact 17, the channel layer CH, and the lower contact 12 may have a cylindrical shape. In another embodiment, the upper contact 17, the channel layer CH, and the lower contact 12 may all have a rectangular column shape.

Figure 3F:
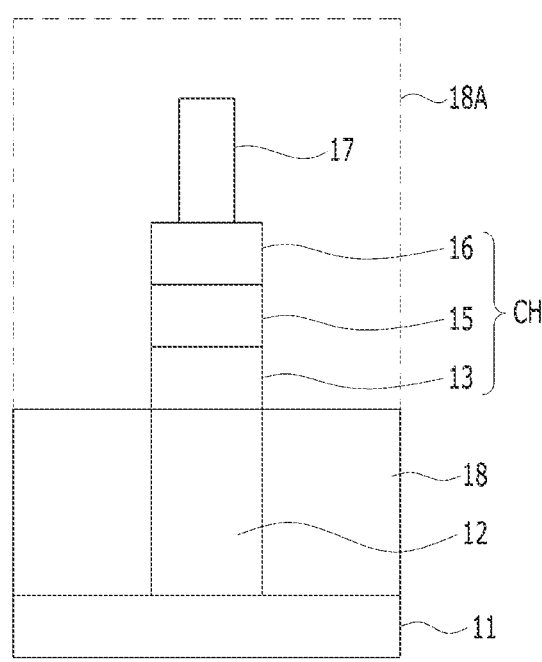

As illustrated in FIG. 3F, an insulation layer 18 covering sidewalls of the lower contact 12 may be formed.

To form the insulation layer 18, after forming an insulation material 18A covering all of the upper contact 17, the channel layer CH, the lower contact 12, and the surface of the substrate 11, the insulation material 18A may be removed to have the same height as the lower contact 12. To remove the insulation material 18A, a process, such as etchback, may be performed. Accordingly, the height of the insulation layer 18 may be the same as the height of the lower contact 12. The insulation layer 12 may include oxide, nitride, or a combination thereof.

Figure 3G:
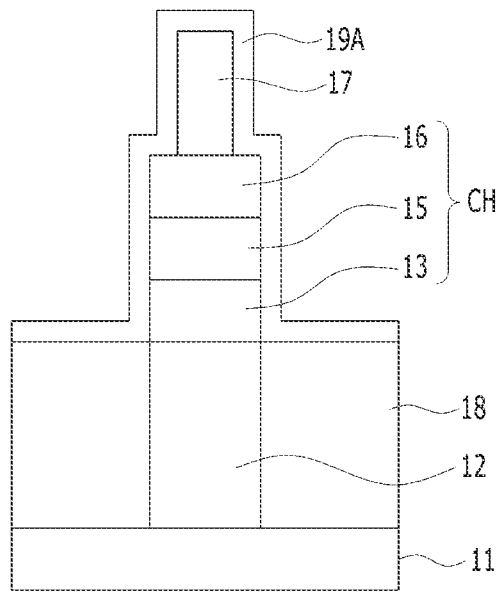

As illustrated in FIG. 3G, a dielectric material 19A may be formed to cover exposed surfaces of the insulation layer 18, the channel layer CH, and the upper contact 17. The dielectric material 19A may be conformally formed along the exposed surfaces of the insulation layer 18, the channel layer CH and the upper contact 17. The dielectric material 19A may be any dielectric material known in the art. The dielectric material 19A according to an embodiment may include a high-k material, such as $HfO_2$, $ZrO_2$, or other metal oxide.

Figure 3H:
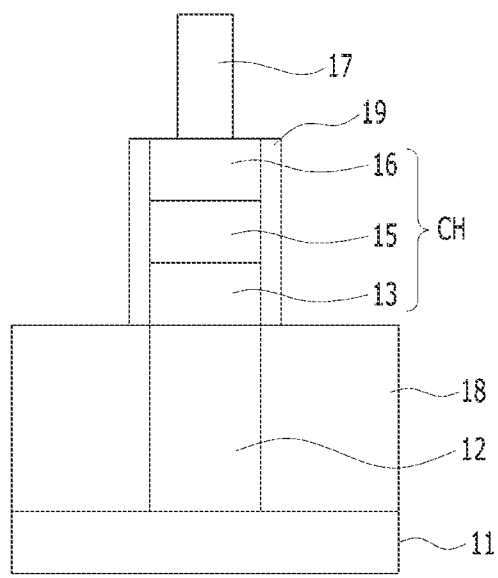

As illustrated in FIG. 3H, the dielectric material 19A may be partially removed to remain only on the sidewall of the channel layer CH. Thus, the dielectric layer 19 may be formed.

The dielectric layer 19 may cover all the exposed sidewalls of the channel layer CH, i.e, the sidewalls of the channel layer CH which are not covered by the insulation layer 18. The height of the dielectric layer 19 may be the same as the height of the channel layer CH. The dielectric layer 19 may be conformally formed on the channel layer CH. In another embodiment, the dielectric layer 19 may cover only some of the exposed sidewalls of the channel layer CH, for example, a pair of dielectric layers 19 parallel to each other may be formed on both opposite exposed sidewalls of the channel layer CH.

Figure 3I:
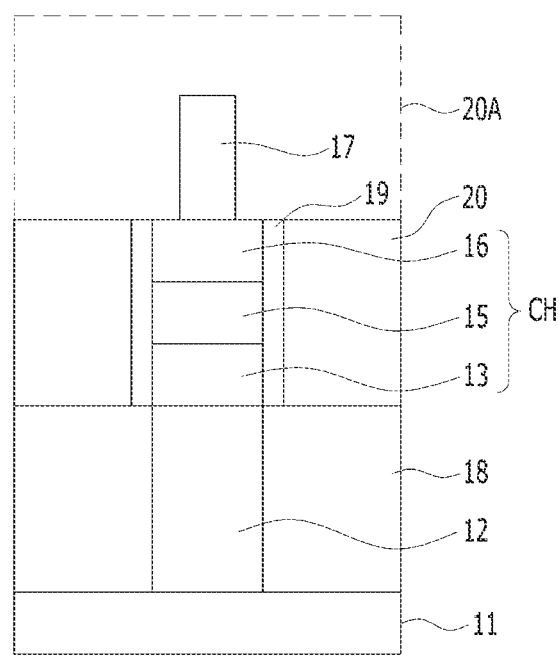

As illustrated in FIG. 3I, a gate 20 covering the exposed surface of the dielectric layer 19 may be formed on the insulation layer 18. To form the gate 20, a gate material 20A may be formed first and then may be partially removed to form the gate 20 having the same height as the dielectric layer 19. Accordingly, the height of the gate 20 may be the same as the height of the channel layer CH. The dielectric layer 19 may be positioned between the gate 20 and the channel layer CH. The gate 20 may cover the upper surface of the insulation layer 18. The gate 20 may include a metal or a metal compound.

The vertical transistor formed according to the present manufacturing method may reduce leakage current by having different doping concentrations of the metal component according to a height position in the channel layer CH.

In the vertical transistor formed according to the present manufacturing method, the doping concentration at the upper surface of the channel layer CH is dose to that of the upper contact 17, and the doping concentration at the lower surface of the channel layer CH is dose to that of the lower contact 12 so that the contact resistance may be enhanced.

FIGS. 4A to 4D are perspective views illustrating examples of vertical transistors. FIGS. 4A to 4D are views in which the dielectric layer 140 and the gate 150 of FIG. 1 are omitted to describe the lower contact 110, the channel layer 120, and the upper contact 130 according to various embodiments. Accordingly, the vertical transistors 101, 102, 103, and 104 of FIGS. 4A to 4D may be similar to each other. The vertical transistors 101, 102, 103, and 104 of FIGS. 4A to 4D may be similar to the vertical transistor 100 of FIG. 2. Accordingly, the same reference denotations as those in FIG. 2 among the reference denotations of FIGS. 4A to 4D may refer to the same components. Descriptions of duplicate components may be omitted or briefly described.

Figure 4A:
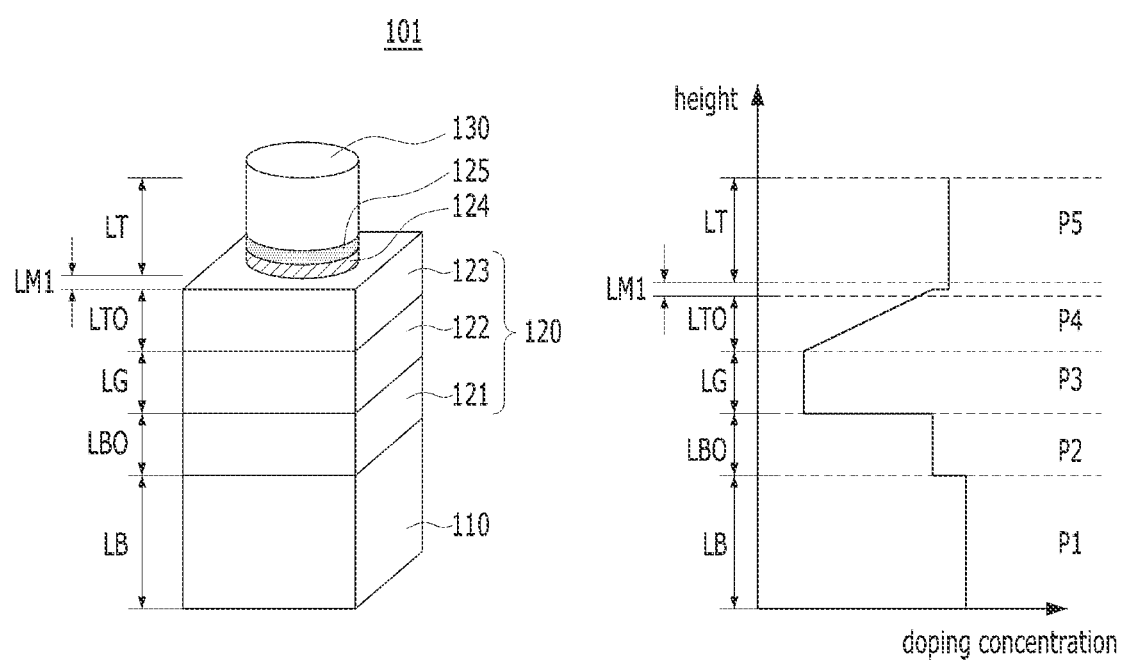
FIGS. 4A, 4B, 4C, and 4D are perspective views illustrating an upper contact, lower contact, and channel layer of a vertical transistor according to an embodiment.

First, as illustrated in FIG. 4A, a vertical transistor 101 may be formed. The vertical transistor 101 may include a upper insertion layer 124 on the upper channel layer 123.

The upper insertion layer 124 may have a cylindrical shape. The upper insertion layer 124 may have the same diameter (or width) as the upper contact 130. The upper insertion layer 124 may overlap the bottom surface of the upper contact 130. The upper insertion layer 124 may partially cover the upper surface of the upper channel layer 123.

The upper insertion layer 124 may be formed of an indium (In) or an indium-tin (InSn) compound. The upper insertion layer 124 may be formed by physical vapor deposition (PVD), chemical vapor is deposition (CVD), or atomic layer deposition (ALD). The upper insertion layer 124 may prevent oxidation of the upper layer by trapping external diffusion of oxygen inside the channel layer 120 in a subsequent heat treatment process, preventing resistance degradation due to metal oxidation. The upper insertion layer 124 may be formed after forming the channel layer 120.

An upper barrier layer 125 may be formed on the upper insertion layer 124. The upper barrier layer 125 may be positioned between the upper contact 130 and the upper insertion layer 124. The upper barrier layer 125 may have a cylindrical shape. The diameter (or width) of the upper barrier layer 125 may be the same as the diameter (or width) of the upper contact 130. The thickness of the upper barrier layer 125 may be the same as or different from the thickness of the upper insertion layer 124.

The upper barrier layer 125 may include a material capable of oxygen scavenging. The upper barrier layer 125 may include a metal or a metal compound. The upper barrier layer 125 may include titanium (Ti), titanium nitride (TiN), or a combination thereof. The upper barrier layer 125 may be formed by a method, such as chemical vapor deposition (CVD), physical vapor deposition (PVD), atomic layer deposition (ALD), plasma enhanced CVD (PECVD), and plasma enhanced ALD (PEALD).

In an embodiment, the upper barrier layer 125 capable of oxygen scavenging is formed between the channel layer 120 and the is upper contact 130, reducing the contact resistance to the upper and lower metal materials. Further, the upper insertion layer 124 capable of trapping oxygen is formed under the upper barrier layer 125, gathering oxygen ions drawn by the scavenging of the upper barrier layer 125 and hence preventing oxidation of the upper barrier layer 125 and an increase in interfacial resistance while reducing contact resistance.

The graph of FIG. 4A illustrates a doping concentration of the metal component as a function of the height position. Metallicity may increase as the doping concentration increases. As the metallicity of the upper surface of the channel layer 120 increases, the contact resistance to the upper contact 130 may decrease. As the metallicity of the lower surface of the channel layer 120 increases, the contact resistance to the lower contact 110 may decrease. The graph of FIG. 4A may be similar to the graph of FIG. 2. Accordingly, the same reference denotations as those in FIG. 2 may refer to the same components.

The doping concentration may be divided into a first doping region P1 according to the height LB of the lower contact, a second doping region P2 according to the height LBO of the lower channel layer, a third doping region P3 according to the height LG of the intermediate channel layer, a fourth doping region P4 according to the height LTO of the upper channel layer, and a fifth doping region P5 according to the height LT of the upper contact and, unlike the graph of FIG. 2, may is further include a region according to the height LM1 of the upper insertion layer 124. The doping concentration according to the height may be continuous.

The doping profile between the third doping region P3 and the second doping region P2 may include an abrupt profile, e.g., a step change. As the difference in doping concentration between the third doping region P3 and the second doping region P2 increases, the difference in doping concentration between the second doping region P2 and the first doping region P1 may decrease. As the difference in doping concentration between the second doping region P2 and the first doping region P1 decreases, the contact resistance to the lower contact 110 may decrease.

The doping concentration of the fourth doping region P4 may increase with a constant slope. For example, the doping concentration of the fourth doping region P4 may increase from a doping concentration equal to the doping concentration of the third doping region P3 to a doping concentration equal to the doping concentration of the second doping region P2. The fourth doping region P4 may include a gradual doping profile. As the fourth doping region P4 has a gradual doping profile, leakage current may be reduced.

The region according to the height LM1 of the upper insertion layer 124 may include a section in which the doping concentration varies. That is, the region according to the height LM1 of the upper insertion layer 124 may include both the highest doping concentration of the fourth doping region P4 and the doping concentration of the fifth doping region P5. The region according to the height LM1 of the upper insertion layer 124 may include both a gradual doping profile and a constant doping profile. As the change in doping concentration decreases in the region according to the height LM1 of the upper insertion layer 124, the contact resistance to the upper contact 130 may decrease.

The fifth doping region P5 may be a region including the upper barrier layer 125 and the upper contact 130. The doping concentration of the fifth doping region P5 may have a constant value. The doping concentration of the fifth doping region P5 may be lower than or equal to the doping concentration of the first doping region P1. The doping concentration of the fifth doping region P5 may be continuous from the doping concentration of the fourth doping region P4.

According to the present embodiment, the contact resistance to the upper contact 130 may be reduced by forming a high doping concentration at the upper and lower surfaces of the channel layer 120. According to the present embodiment, the leakage current of the vertical transistor 101 may be reduced by forming a doping profile of metal component varying according to the height.

Figure 4B:
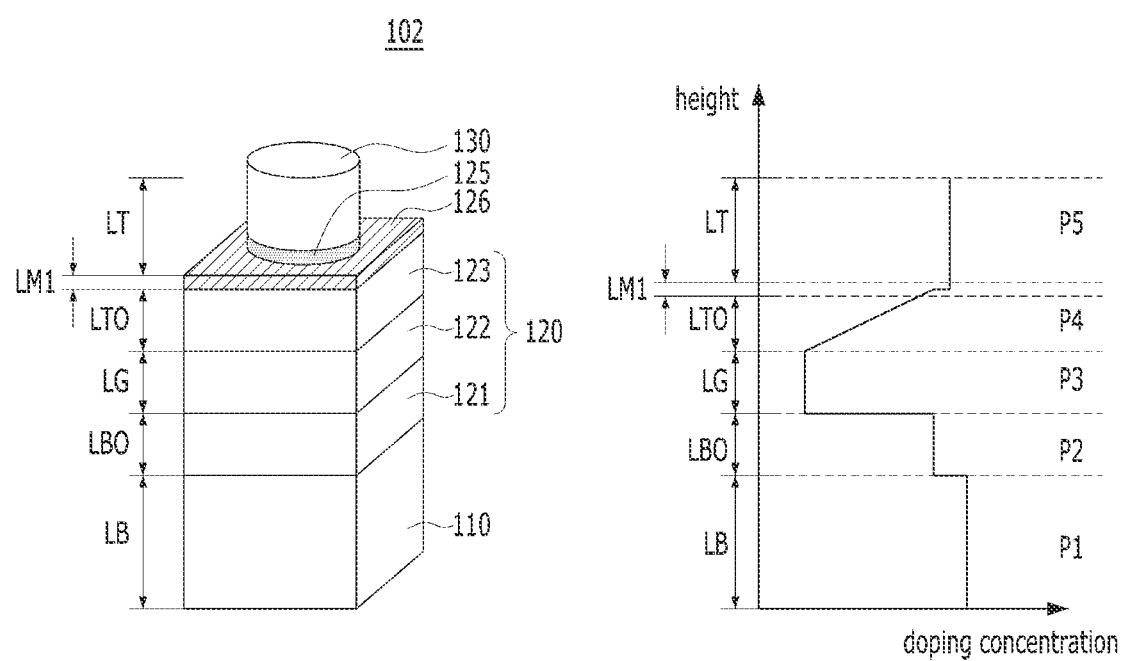

As illustrated in FIG. 4B, a vertical transistor 102 may be formed. The vertical transistor 102 may include a upper insertion layer 126 formed on the upper channel layer 123. The vertical transistor 102 s may include an upper barrier layer 125 formed on the upper insertion layer 126. The upper insertion layer 126 may have a rectangular column shape. The upper insertion layer 126 may have the same width as the upper channel layer 123. The upper barrier layer 125 may cover the bottom surface of the upper contact 130. The upper insertion layer 126 may cover the upper surface of the upper channel layer 123.

The graph of FIG. 48 may be similar to the graph of FIG. 4A. Accordingly, the same reference numerals as those in FIG. 4A may refer to the same components.

Figure 4C:
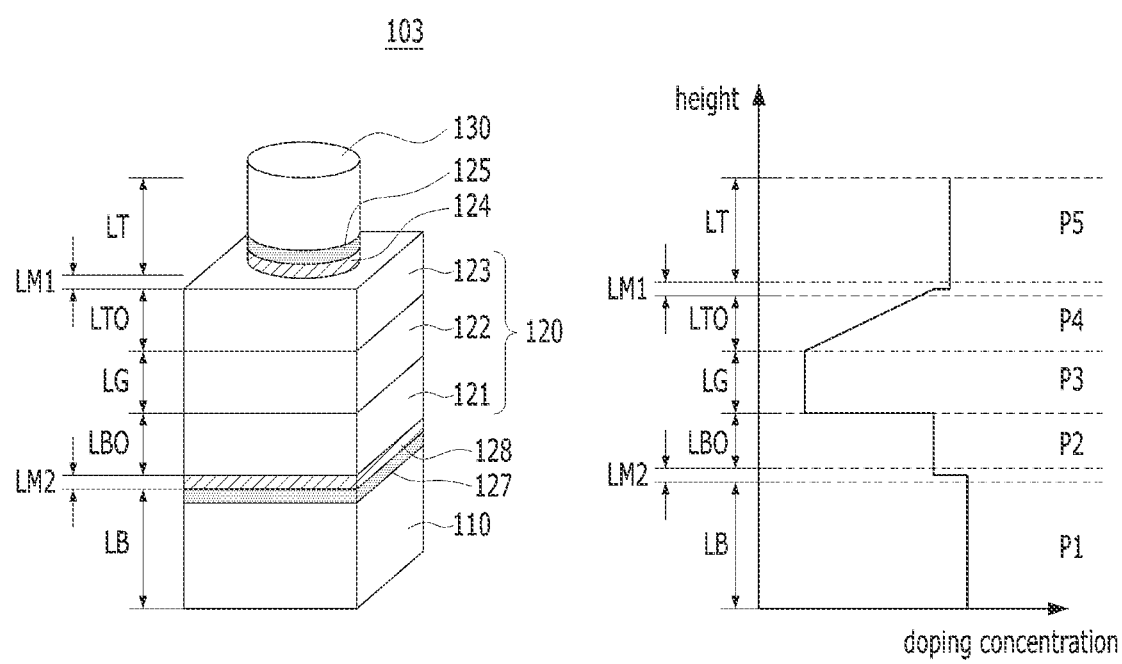

As illustrated in FIG. 4C, a vertical transistor 103 may be formed. The vertical transistor 103 may include a upper insertion layer 124 and an upper barrier layer 125, similar to the vertical transistor 101 of FIG. 4A. Unlike the vertical transistor 101 of FIG. 4A, the vertical transistor 103 may further include a lower barrier layer 127 formed between the lower contact 110 and the lower channel layer 121 and a lower insertion layer 128 formed on the lower barrier layer 127.

The lower barrier layer 127 may have a rectangular column shape. The width of the lower barrier layer 127 may be the same as the width of the lower contact 110. The lower harrier layer 127 may include the same material as the upper barrier layer 125. Accordingly, the lower barrier layer 127 may include a material capable of oxygen scavenging. The lower barrier layer 127 may include a metal or a metal compound. The lower barrier layer 127 may include titanium (Ti), titanium nitride (TiN), or a combination thereof. The lower barrier layer 127 may be formed by a method, such as chemical vapor deposition (CVD), physical vapor deposition (PVD), atomic layer deposition (ALD), plasma enhanced CVD (PECVD), and plasma enhanced ALD (PEALD).

The lower insertion layer 128 may be formed on the lower barrier layer 127. The lower insertion layer 128 may have a rectangular column shape. The lower insertion layer 128 may have the same width as the lower contact 110. The lower insertion layer 128 may overlap the upper surface of the lower contact 110. The lower insertion layer 128 may cover the lower surface of the lower channel layer 121. The thickness of the lower insertion layer 128 may be the same as or different from the thickness of the lower barrier layer 127.

The lower insertion layer 128 may include the same material as the upper insertion layer 124. The lower insertion layer 128 may be formed of indium (In) or an indium-tin (InSn) compound. The lower insertion layer 128 may be formed by physical vapor deposition (PVD), chemical vapor deposition (CVD), or atomic layer deposition (ALD). The lower insertion layer 128 may prevent oxidation of the lower layer by trapping the external diffusion of oxygen inside the channel layer 120 in a subsequent heat treatment process, preventing resistance degradation due to metal oxidation.

In an embodiment, the upper barrier layer 125 and the lower barrier layer 127 capable of oxygen scavenging, are formed, respectively, between the channel layer 120 and the upper contact 130 and between the channel layer 120 and the lower contact 110, reducing the contact resistance to the upper and lower metal materials. Further, the upper insertion layer 124 and the lower insertion layer 128 capable of trapping oxygen are formed under the upper barrier layer 125 and over the lower barrier layer 127, respectively, gathering the oxygen ions drawn by the scavenging of the upper barrier layer 125 and the lower barrier layer 127 and, hence, preventing oxidation of the upper barrier layer 125 and the lower barrier layer 127 and an increase in interfacial resistance while reducing contact resistance.

The graph of FIG. 4C illustrates the doping concentration of the metal component according to the height. Metallicity may increase as the doping concentration increases. As the metallicity of the upper surface of the channel layer 120 increases, the contact resistance to the upper contact 130 may decrease. As the metallicity of the lower surface of the channel layer 120 increases, the contact resistance to the lower contact 110 may decrease. The graph of FIG. 4C may be similar to the graph of FIG. 4A. Accordingly, the same reference numerals as those in FIG. 4A may refer to the same components.

The doping concentration may be divided into a first doping region P1 according to the height LB of the lower contact, a second doping region P2 according to the height LBO of the lower channel layer, a third doping region P3 according to the height LG of the intermediate channel layer, a fourth doping region P4 according to the height LTO of the upper channel layer, and a fifth doping region P5 according to the height LT of the upper contact and, unlike the graph of FIG. 4A, may is further include a region according to the height LM2 of the lower insertion layer 128. The doping concentration according to the height may be continuous.

The first doping region P1 may be a region including the lower contact 110 and the lower barrier layer 127. The doping concentration of the first doping region P1 may have a constant value.

The region according to the height LM2 of the lower insertion layer 128 may be positioned between the first doping region P1 and the second doping region P2. The region according to the height LM2 of the lower insertion layer 128 may include both the doping concentration of the first doping region P1 and the doping concentration of the second doping region P2. The region according to the height LM2 of the lower insertion layer 128 may include a section in which the doping concentration changes. That is, the region according to the height LM2 of the lower insertion layer 128 may include a section in which the doping concentration changes from the doping concentration of the first doping region P1 to the doping concentration of the second doping region P2. As the change in the region according to the height LM2 of the lower insertion layer 128 decreases, the contact resistance to the lower contact 110 may decrease.

The doping profile between the third doping region P3 and the second doping region P2 may include an abrupt profile, e.g., a step change. As the difference in doping concentration between the third doping region P3 and the second doping region P2 increases, the change in doping concentration in the region according to the height LM2 of the lower insertion layer 128 may decrease.

The fourth doping region P4 may include a gradual doping profile. As the fourth doping region P4 has a gradual doping profile, leakage current may be reduced.

The region according to the height LM1 of the upper insertion layer 124 may include a section in which the doping concentration varies. That is, the region according to the height LM1 of the upper insertion layer 124 may connect the highest doping concentration in the fourth doping region P4 and the doping concentration in the fifth doping region P5. The region according to the height LM1 of the upper insertion layer 124 may include both a gradual doping profile and a constant doping profile. As the change in doping concentration decreases in the region according to the height LM1 of the upper insertion layer 124, the contact resistance to the upper contact 130 may decrease.

The fifth doping region P5 may be a region including the upper barrier layer 125 and the upper contact 130. The doping concentration of the fifth doping region P5 may have a constant value.

According to the present embodiment, the contact resistance to the lower contact 110 and the upper contact 130 may be reduced by forming a higher doping concentration at the upper and lower surfaces of the channel layer 120. According to the present embodiment, the leakage current of the vertical transistor 103 may be is reduced by varying the doping profile of impurities according to the height.

Figure 4D:
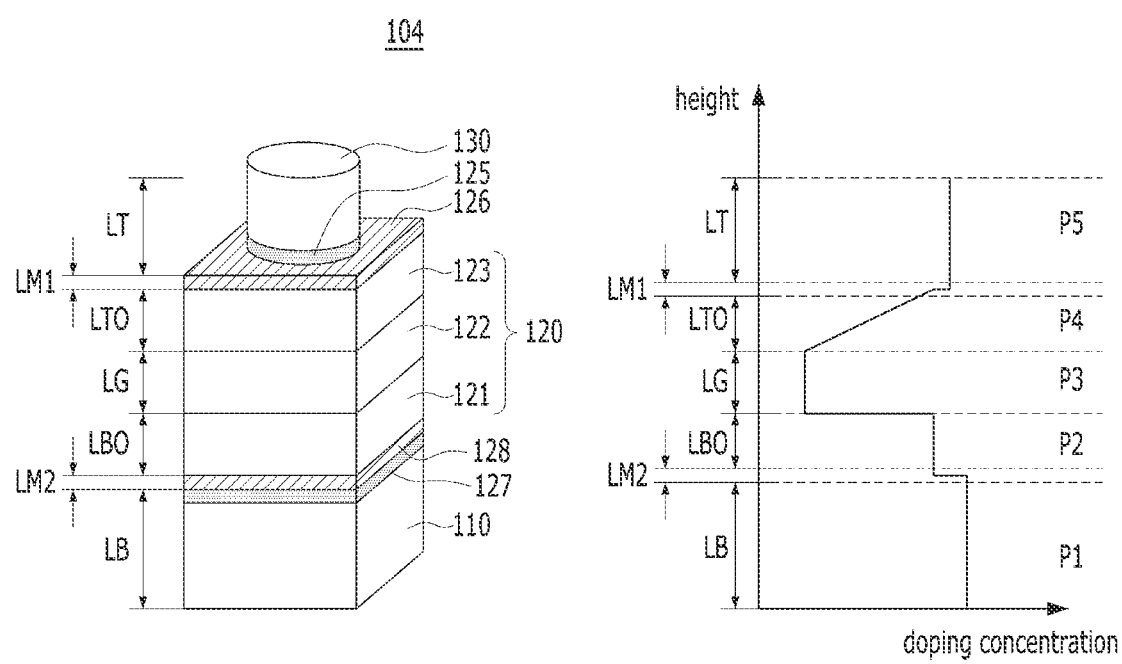

As illustrated in FIG. 4D, a vertical transistor 104 may be formed. The vertical transistor 104 may include a upper insertion layer 126 and an upper barrier layer 125, similar to the vertical transistor 102 of FIG. 4B. Unlike the vertical transistor 102 of FIG. 4B, the vertical transistor 104 has a lower barrier layer 127 between the lower contact 110 and the lower channel layer 121 and a lower insertion layer 128 on the lower barrier layer 127. The lower barrier layer 127 and the lower insertion layer 128 of the vertical transistor 104 may be the same as the vertical transistor 103 of FIG. 4C.

The graph of FIG. 4D may be similar to the graph of FIG. 4C. Accordingly, the same reference denotations as those in FIG. 4C may refer to the same components.

Figure 5:
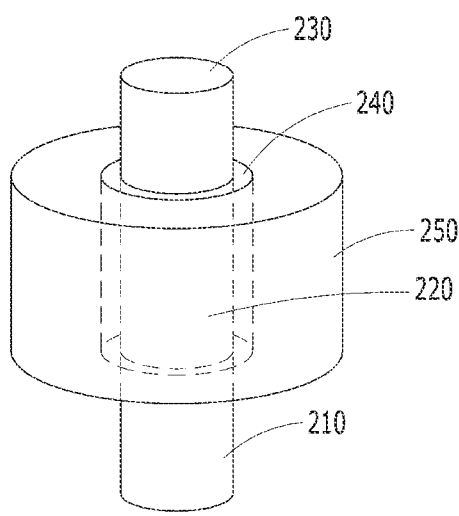
FIG. 5 is a perspective view illustrating a vertical transistor according to an embodiment.

FIG. 5 is a view illustrating a vertical transistor 200 according to another embodiment. The vertical transistor 200 may be similar to the vertical transistor 100 of FIG. 1. The vertical transistor 200 may be similar to the vertical transistor 100 of FIG. 1 except for the shape of the components. Accordingly, the materials included in the components of the vertical transistor 200 may be the same or similar to the materials included in the components of the vertical transistor 100 of FIG. 1.

The vertical transistor 200 may include a cylindrical lower contact 210, a channel layer 220 formed on the lower contact 210, and an upper contact 230 formed on the channel layer 220. The lower contact 210, the channel layer 220, and the upper contact 23 may all have a cylindrical shape. The lower contact 210, the channel layer 220, and the upper contact 23 may have the same diameter (also referred to as width). A dielectric layer 240 may be formed on the channel layer 220. The dielectric layer 240 may cover the channel layer 220. The gate 250 may be formed to surround the dielectric layer 240. The thickness of the gate 250 may be larger than the thickness of the dielectric layer 240. The gate 250 may cover the channel layer 220. Accordingly, the dielectric layer 240 may be positioned between the gate 250 and the channel layer 220.

Figure 6:
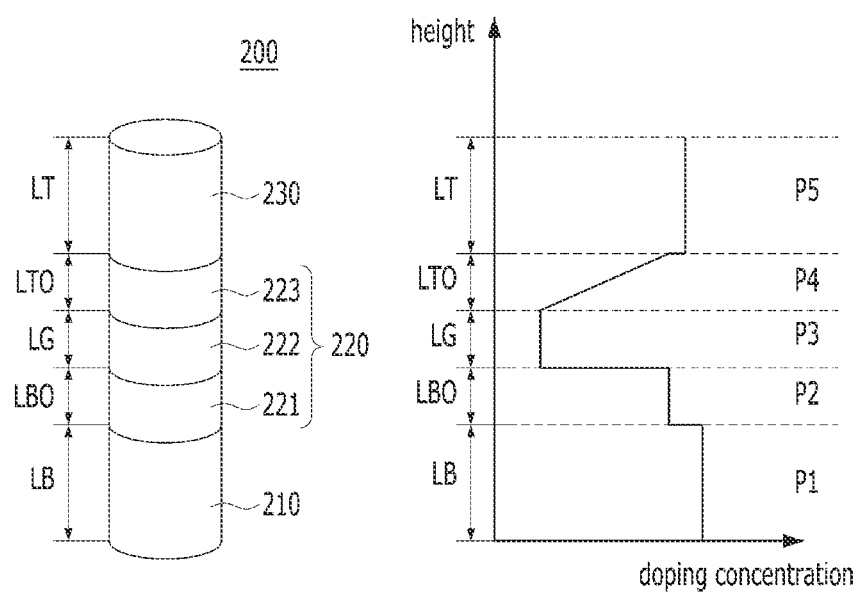
FIG. 6 is a perspective view illustrating an upper contact, lower contact, and channel layer of a vertical transistor according to an embodiment.

FIG. 6 is a view in which the dielectric layer 240 and the gate 250 of FIG. 5 are omitted to describe the channel layer 220 of FIG. 5.

As illustrated in FIG. 6, the channel layer 220 may include a lower channel layer 221 on the lower contact 120, an intermediate channel layer 222 on the lower channel layer 221, and an upper channel layer 223 on the intermediate channel layer 222. That is, the channel layer 220 may include a stack of the lower channel layer 221, the intermediate channel layer 222, and the upper channel layer 223. The height LBO of the lower channel layer 221, the height LG of the intermediate channel layer 222, and the height LTO of the upper channel layer 223 may be the same or different.

The channel layer 220 may include an oxide. The channel layer 220 may include a metal material and an oxygen material. The channel layer 220 may be doped with an impurity. The channel layer 220 may include an oxide semiconductor. The channel layer 220 may have a non-uniform doping profile according to the height. The doping profile of impurities may be different in the lower channel layer 221, the intermediate channel layer 222, and the upper channel layer 223.

The graph of FIG. 6 illustrates the doping concentration of the metal component according to the height. Metallicity may increase as the doping concentration increases. As the metallicity of the upper surface of the channel layer 220 increases, the contact resistance to the upper contact 230 may decrease. As the metallicity of the lower surface of the channel layer 220 increases, the contact resistance to the lower contact 210 may decrease.

The doping concentration may be divided into a first doping region P1 according to the height LB of the lower contact, a second doping region P2 according to the height LBO of the lower channel layer, a third doping region P3 according to the height LG of the intermediate channel layer, a fourth doping region P4 according to the height LTO of the upper channel layer, and a fifth doping region P5 according to the height LT of the upper contact. The doping concentration of the first to fifth doping regions P1 to P5 may be continuous.

First, the doping concentrations of the first doping region P1, the second doping region P2, and the third doping region P3 may each include a constant value. The doping profiles of the first doping region P1, the second doping region P2, and the third doping region P3 may include a stepped profile. The doping concentration of the first doping region P1 may be greater than the doping concentration of the second doping region P2 and the third doping region P3. The doping concentration of the second doping region P2 may be greater than the doping concentration of the third doping region P3. The third doping region P3 may include the lowest doping concentration among the first to fifth doping regions P1 to P5. The difference in doping concentration between the second doping region P2 and the third doping region P3 may be greater than the difference in doping concentration between the first doping region P1 and the second doping region P2. The difference in doping concentration between the second doping region P2 and the third doping region P3 may be at least two times greater than the difference in doping concentration between the first doping region P1 and the second doping region P2. That is, the doping profile between the third doping region P3 and the second doping region P2 may include an abrupt profile, e.g., a step change. As the difference in doping concentration between the third doping region P3 and the second doping region P2 increases, the difference in doping concentration between the second doping region P2 and the first doping region P1 may decrease. As the difference in doping concentration between the second doping region P2 and the first doping region P1 decreases, the contact resistance to the lower contact 210 may decrease.

The doping concentration of the fourth doping region P4 may increase with a constant slope. The doping concentration of the fourth doping region P4 may increase from a doping concentration equal to the doping concentration of the third doping region P3 to a doping concentration equal to the doping concentration of the fifth doping region P5. The doping concentration of the fourth doping region P4 may increase from a doping concentration equal to the doping concentration of the third doping region P3 to a doping concentration equal to the doping concentration of the second doping region P2. That is, the fourth doping region P4 may include a gradual doping profile. In another embodiment, the doping profile of the fourth doping region P4 may increase as the slope of the doping concentration according to the height increases. In another embodiment, the doping profile of the fourth doping region P4 may increase as the slope decreases. As the fourth doping region P4 has a gradual doping profile, leakage current may be reduced. As the difference in doping concentration between the fourth doping region P4 and the fifth doping region P5 decreases, the contact resistance to the upper contact 230 may decrease.

The doping concentration of the fifth doping region P5 may have a constant value. The doping concentration of the fifth doping region P5 may be lower than or equal to the doping concentration of the first doping region P1. The doping concentration of the fifth doping region P5 may be continuous from the doping concentration of the fourth doping region P4.

According to the present embodiment, the leakage current of the vertical transistor 200 may be reduced by varying the doping profile of impurities according to the height.

According to the present embodiment, the contact resistance to the lower contact 210 and the upper contact 230 may be reduced by forming a higher doping concentration at the upper and lower surfaces of the channel layer 220.

Figure 7A:
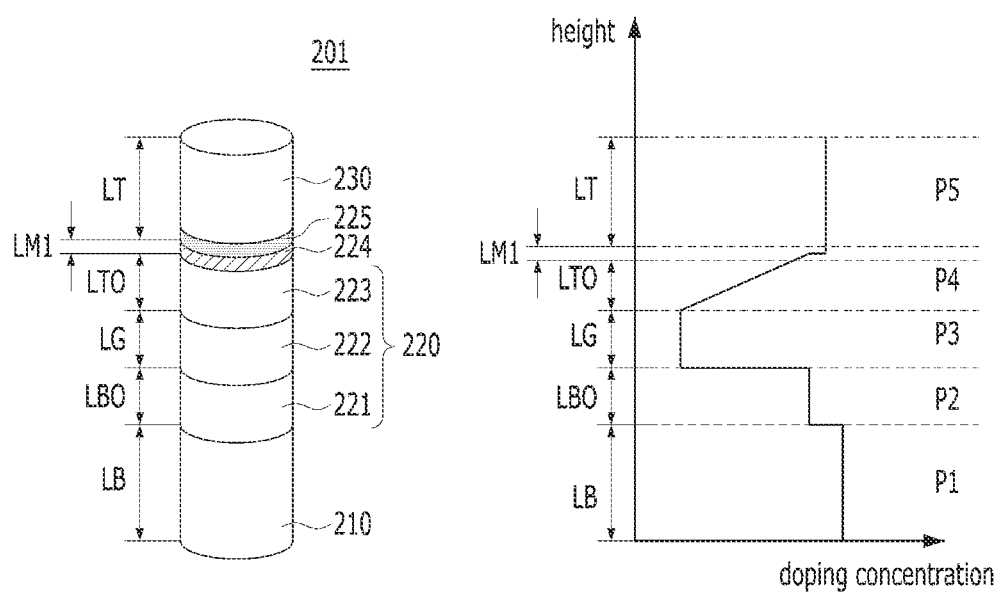
FIGS. 7A and 7B are perspective views illustrating an upper contact, lower contact, and channel layer of a vertical transistor according to an embodiment.
Figure 7B:
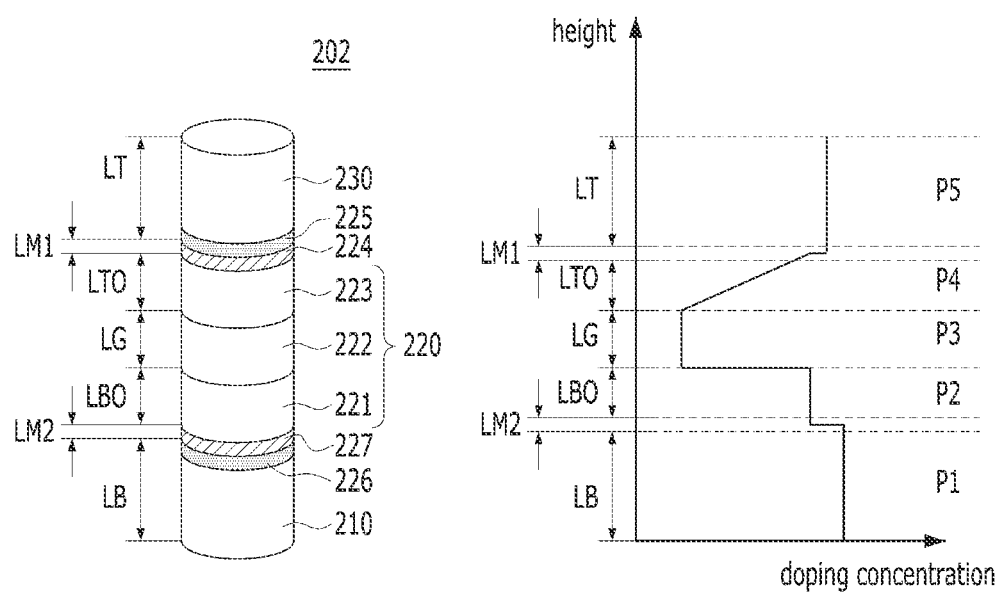

FIGS. 7A to 7B are perspective views illustrating example vertical transistors. FIGS. 7A to 7B are views in which the dielectric layer 240 and the gate 250 of FIG. 5 are omitted to describe the lower contact 210, the channel layer 220, and the upper contact 230 according to various embodiments. Accordingly, the vertical transistors 201 and 202 of FIGS. 7A to 7B may be similar to each other. The vertical transistors 201 and 202 of FIGS. 7A to 7B may be similar to the vertical transistor 200 of FIG. 6. Accordingly, the same reference denotations as those in FIG. 6 among the reference denotations of FIGS. 7A to 7B may refer to the same components.

First, as illustrated in FIG. 7A, a vertical transistor 201 may be formed. The vertical transistor 201 may include a upper insertion layer 224 formed on the upper channel layer 223.

The upper insertion layer 224 may have a cylindrical shape. The upper insertion layer 224 may have the same diameter (or width) as the upper contact 230. The upper insertion layer 224 may overlap the lower surface of the upper contact 230. The upper insertion layer 224 may partially cover the upper surface of the upper channel layer 223.

The upper insertion layer 224 may be formed of an indium (In) or an indium-tin (InSn) compound. The upper insertion layer 224 may be formed by physical vapor deposition (PVD), chemical vapor deposition (CVD), or atomic layer deposition (ALD). The upper insertion layer 224 may prevent oxidation of the upper layer by trapping external diffusion of oxygen inside the channel layer 220 in a subsequent heat treatment process, preventing resistance degradation due to metal oxidation. The upper insertion layer 224 may be formed after forming the channel layer 220.

An upper barrier layer 225 may be formed on the upper insertion layer 224. The upper barrier layer 225 may be positioned between the upper contact 230 and the upper insertion layer 224. The upper barrier layer 225 may have a cylindrical shape. The width of the upper barrier layer 225 may be the same as the width of the upper contact 230. The thickness of the upper barrier layer 225 may be the same as or different from the thickness of the upper insertion layer 224.

The upper barrier layer 225 may include a material capable of oxygen scavenging. The upper barrier layer 225 may include a metal or a metal compound. The upper barrier layer 225 may include titanium (Ti), titanium nitride (TiN), or a combination thereof. The upper barrier layer 225 may be formed by a method, such as chemical vapor deposition (CVD), physical vapor deposition (PVD), atomic layer is deposition (ALD), plasma enhanced CVD (PECVD), and plasma enhanced ALD (PEALD).

In an embodiment, the upper barrier layer 225 capable of oxygen scavenging is formed between the channel layer 220 and the upper contact 230, reducing the contact resistance to the upper and lower metal materials. Further, the upper insertion layer 224 capable of trapping oxygen is formed under the upper barrier layer 225, gathering oxygen ions drawn by the scavenging of the upper barrier layer 225 and hence preventing oxidation of the upper barrier layer 224 and an increase in interfacial resistance while reducing contact resistance.

The graph of FIG. 7A illustrates the doping concentration of the metal component according to the height. Metallicity may increase as the doping concentration increases. As the metallicity of the upper surface of the channel layer 220 increases, the contact resistance to the upper contact 230 may decrease. As the metallicity of the lower surface of the channel layer 220 increases, the contact resistance to the lower contact 210 may decrease. The graph of FIG. 7A may be similar to the graph of FIG. 6. Accordingly, the same reference denotations as those in FIG. 6 may refer to the same components. Description of duplicate components will be omitted.

The doping concentration may be divided into a first doping region P1 according to the height LB of the lower contact, a second doping region P2 according to the height LBO of the lower channel layer, is a third doping region P3 according to the height LG of the intermediate channel layer, a fourth doping region P4 according to the height LTO of the upper channel layer, and a fifth doping region P5 according to the height LT of the upper contact and, unlike the graph of FIG. 6, may further include a region according to the height LM1 of the upper insertion layer 224. The doping concentration according to the height may be continuous.

The doping profile between the third doping region P3 and the second doping region P2 may include an abrupt profile, e.g., a step change. As the difference in doping concentration between the third doping region P3 and the second doping region P2 increases, the difference in doping concentration between the second doping region P2 and the first doping region P1 may decrease. As the difference in doping concentration between the second doping region P2 and the first doping region P1 decreases, the contact resistance to the lower contact 210 may decrease.

The doping concentration of the fourth doping region P4 may increase with a constant slope. For example, the doping concentration of the fourth doping region P4 may increase from a doping concentration equal to the doping concentration of the third doping region P3 to a doping concentration equal to the doping concentration of the second doping region P2. The fourth doping region P4 may include a gradual doping profile. As the fourth doping region P4 has a gradual doping profile, leakage current may be reduced.

The region according to the height LM1 of the upper insertion layer 224 may include a section in which the doping concentration varies. That is, the region according to the height LM1 of the upper insertion layer 224 may connect the highest doping concentration in the fourth doping region P4 and the doping concentration in the fifth doping region P5. The region according to the height LM1 of the upper insertion layer 224 may include both a gradual doping profile and a constant doping profile. As the change in doping concentration decreases in the region according to the height LM1 of the upper insertion layer 224, the contact resistance to the upper contact 230 may decrease.

The fifth doping region P5 may be a region including the upper barrier layer 225 and the upper contact 230. The doping concentration of the fifth doping region P5 may have a constant value. The doping concentration of the fifth doping region P5 may be lower than or equal to the doping concentration of the first doping region P1. The doping concentration of the fifth doping region P5 may be continuous from the doping concentration of the fourth doping region P4.

According to the present embodiment, the contact resistance to the upper contact 230 may be reduced by increasing the doping concentration of the upper surface of the channel layer 220. According to the present embodiment, the leakage current of the vertical transistor 201 may be reduced by forming a doping profile of impurities varying according to the height.

As illustrated in FIG. 7B, a vertical transistor 202 may be formed. The vertical transistor 202 may include a upper insertion layer 224 and an upper barrier layer 225, similar to the vertical transistor 201 of FIG. 7A. Unlike the vertical transistor 201 of FIG. 7A, the vertical transistor 202 may further include a lower barrier layer 226 between the lower contact 210 and the lower channel layer 221 and a lower insertion layer 227 on the lower barrier layer 226.

The lower barrier layer 226 may have a cylindrical shape. The diameter of the lower barrier layer 226 may be the same as the diameter of the lower contact 210. The lower barrier layer 226 may include the same material as the upper barrier layer 225. Accordingly, the lower barrier layer 226 may include a material capable of oxygen scavenging. The lower barrier layer 226 may include a metal or a metal compound. The lower barrier layer 226 may include titanium (Ti), titanium nitride (TiN), or a combination thereof. The lower barrier layer 226 may be formed by a method, such as chemical vapor deposition (CVD), physical vapor deposition (PVD), atomic layer deposition (ALD), plasma enhanced CVD (PECVD), and plasma enhanced ALD (PEALD).

The lower insertion layer 227 may be formed on the lower barrier layer 226. The lower insertion layer 227 may have a cylindrical shape. The lower insertion layer 227 may have the same diameter (or width) as the lower contact 210. The lower barrier layer 226 may cover the upper surface of the lower contact 210. The lower insertion layer 227 may cover the lower surface of the lower channel layer 221. The thickness of the lower insertion layer 227 may be the same as or different from the thickness of the lower barrier layer 226.

The lower insertion layer 227 may include the same material as the upper insertion layer 224. The lower insertion layer 227 may be formed of indium (In) or an indium-tin (InSn) compound. The lower insertion layer 227 may be formed by physical vapor deposition (PVD), chemical vapor deposition (CVD), or atomic layer deposition (ALD). The lower insertion layer 227 may prevent oxidation of the lower layer by trapping the external diffusion of oxygen inside the channel layer 220 in a subsequent heat treatment process, preventing resistance degradation due to metal oxidation.

In an embodiment, the upper barrier layer 225 and the lower barrier layer 226 capable of oxygen scavenging, respectively, are formed between the channel layer 220 and the upper contact 230 and between the channel layer 220 and the lower contact 210, for reducing the contact resistance to the upper and lower metal materials. Further, the upper insertion layer 224 and the lower insertion layer 227 capable of trapping oxygen are formed under the upper barrier layer 225 and over the lower barrier layer 226, respectively, gathering the oxygen ions drawn by the scavenging of the upper barrier layer 225 and the lower barrier layer 226 and hence preventing oxidation of the upper barrier layer 225 and the lower barrier layer 226 and an increase in interfacial resistance while reducing contact resistance.

The graph of FIG. 76 illustrates the doping concentration of the metal component according to the height. Metallicity may increase as the doping concentration increases. As the metallicity of the upper surface of the channel layer 220 increases, the contact resistance to the upper contact 230 may decrease. As the metallicity of the lower surface of the channel layer 220 increases, the contact resistance to the lower contact 210 may decrease. The graph of FIG. 7B may be similar to the graph of FIG. 7A. Accordingly, the same reference numerals as those in FIG. 7A may refer to the same components. Description of duplicate components a ill be omitted.

The doping concentration may be divided into a first doping region P1 according to the height LB of the lower contact, a second doping region P2 according to the height LBO of the lower channel layer, a third doping region P3 according to the height LG of the intermediate channel layer, a fourth doping region P4 according to the height LTO of the upper channel layer, and a fifth doping region P5 according to the height LT of the upper contact and, unlike the graph of FIG. 7A, may further include a region according to the height LM2 of the lower insertion layer 227. The doping concentration according to the height may be continuous.

The first doping region P1 may be a region including the lower contact 210 and the lower barrier layer 226. The doping concentration of the first doping region P1 may have a constant value.

The region according to the height LM2 of the lower insertion layer 227 may be positioned between the first doping region P1 and the second doping region P2. The region according to the height LM2 of the lower insertion layer 227 may include both the doping concentration of the first doping region P1 and the doping concentration of the second doping region P2. The region according to the height LM2 of the lower insertion layer 227 may include a section in which the doping concentration changes. That is, the region according to the height LM2 of the lower insertion layer 227 may include a section in which the doping concentration changes from the doping concentration of the first doping region Pt to the doping concentration of the second doping region P2. As the change in the region according to the height LM2 of the lower insertion layer 227 decreases, the contact resistance to the lower contact 210 may decrease.

The doping profile between the third doping region P3 and the second doping region P2 may include an abrupt profile, e.g., a step change. As the difference in doping concentration between the third doping region P3 and the second doping region P2 increases, the change in doping concentration in the region according to the height LM2 of the lower insertion layer 227 may decrease.

The fourth doping region P4 may include a gradual doping profile. As the fourth doping region P4 has a gradual doping profile, leakage current may be reduced.

The region according to the height LM1 of the upper insertion layer 224 may include a section in which the doping concentration varies. That is, the region according to the height LM1 of the upper insertion layer 224 may connect the highest doping concentration in the fourth doping region P4 and the doping concentration in the fifth doping region P5. The region according to the height LM1 of the upper insertion layer 224 may include both a gradual doping profile and a constant doping profile. As the change in doping concentration decreases in the region according to the height LM1 of the upper insertion layer 224, the contact resistance to the upper contact 230 may decrease.

The fifth doping region P5 may be a region including the upper barrier layer 225 and the upper contact 230. The doping concentration of the fifth doping region P5 may have a constant value.

According to the present embodiment, the contact resistance to the lower contact 210 and the upper contact 230 may be reduced by forming a higher doping concentration at the upper and lower surfaces of the channel layer 220. According to the present embodiment, the leakage current of the vertical transistor 202 may be reduced by forming a doping profile of impurities varying according to the height.

Figure 8:
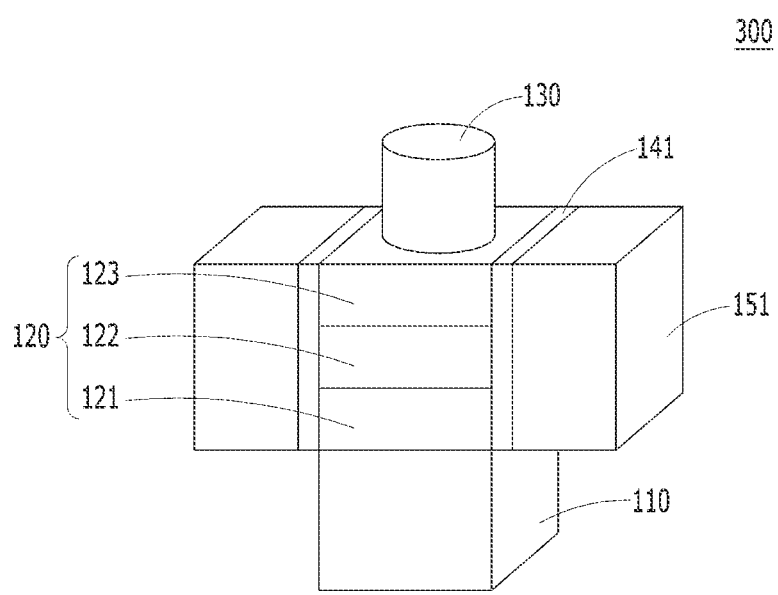
FIG. 8 is a perspective view illustrating a vertical transistor according to an embodiment.

FIG. 8 is a perspective view illustrating a variation to the vertical transistor of FIG. 1. The vertical transistor 300 of FIG. 8 may be similar to the vertical transistor 100 of FIG. 1. Accordingly, the same reference denotations as those in FIG. 1 may refer to the same components. The vertical transistor 300 of FIG. 8 may have a similar is structure to the vertical transistor 100 of FIG. 1 except for the dielectric layer 141 and the gate 151. Accordingly, to avoid redundancy, descriptions of components already described above will be omitted herein.

As illustrated in FIG. 8, the gate 151 may cover a pair of opposite sidewalls of the channel layer 120. A pair of parallel gates 151 may be formed. A dielectric layer 141 may be formed between the gate 151 and the channel layer 120. Accordingly, a pair of parallel dielectric layers 141 may be formed on a pair of opposite sidewalls of the channel layer 120. The dielectric layer 141 and the gate 151 may include the same material as the dielectric layer 140 and the gate 150 of FIG. 1.

Although not shown, the vertical transistor 300 of FIG. 8 may include a lower barrier layer, a lower insertion layer, a upper insertion layer, and an upper barrier layer as illustrated in FIGS. 4A to 4C. The vertical transistor 300 of FIG. 8 may include a cylindrical lower electrode and channel layer as illustrated in FIG. 5, and may include a lower barrier layer, a lower insertion layer, a upper insertion layer, and an upper barrier layer as illustrated in FIGS. 7A to 7B.

While the disclosure has been shown and described in relation to embodiments thereof, it will be readily appreciated by one of ordinary skill in the art that various changes or modifications may be made thereto without departing from the technical spirit of the disclosure.

What is claimed is:

1. A vertical transistor comprising:
   a lower contact on a substrate;
   a channel layer including a lower channel layer, an intermediate channel layer, and an upper channel layer sequentially formed on the lower contact, the channel layer including a metal component and an oxygen component; and
   an upper contact on the upper channel layer, wherein the channel layer has a gradual doping profile in which a doping concentration of the metal component is lowest in the intermediate channel layer and, in the upper channel layer, gradually increases towards the upper contact, wherein the doping concentration of each metal component doped in the lower channel layer and the intermediate channel layer is maintained uniformly, wherein the channel layer has an abrupt doping profile in which the doping concentration of the metal component sharply increases at a boundary between the intermediate channel layer and the lower channel layer, and wherein the lower channel layer is a single layer, and the doping concentration of metal component doped in the lower channel layer is maintained constant throughout the lower channel layer.

2. The vertical transistor of claim 1, wherein the channel layer includes at least any one of oxygen (O), indium (In), gallium (Ga), or zinc (Zn).

3. The vertical transistor of claim 1, wherein the channel layer is doped with an impurity.

4. The vertical transistor of claim 3, wherein the impurity includes silicon (Si) or germanium (Ge).

5. The vertical transistor of claim 1, wherein the lower channel layer is formed in a low-concentration oxygen atmosphere, and the intermediate channel layer and the upper channel layer are formed in a high-concentration oxygen atmosphere.

6. The vertical transistor of claim 1, wherein the upper channel layer has a constant doping concentration of the metal component at a surface of the upper channel layer, and wherein the doping concentration of the metal component at the surface of the upper channel layer is the same as that of the upper contact.

7. The vertical transistor of claim 1, further comprising:
a upper insertion layer on the upper channel layer; and
an upper barrier layer between the upper insertion layer and the upper contact.

8. The vertical transistor of claim 7, wherein
the upper insertion layer includes indium or an indium-tin compound, and wherein
the upper barrier layer includes titanium (Ti) or titanium nitride.

9. The vertical transistor of claim 7, further comprising:
a lower barrier layer on the lower contact; and
a lower insertion layer between the lower barrier layer and the lower channel layer.

10. The vertical transistor of claim 9, wherein
the lower insertion layer includes the same material as the upper insertion layer, and wherein
the lower barrier layer includes the same material as the upper barrier layer.

* * * * *